United States Patent [19]
Shou et al.

[11] Patent Number: 5,864,312
[45] Date of Patent: Jan. 26, 1999

[54] QUANTIZING CIRCUIT

[75] Inventors: Guoliang Shou; Makoto Yamamoto; Sunao Takatori, all of Tokyo, Japan

[73] Assignees: Sharp Kabushiki Kaisha, Osaka; Yozan, Inc., Tokyo, both of Japan

[21] Appl. No.: 764,639

[22] Filed: Dec. 11, 1996

[30] Foreign Application Priority Data

Dec. 12, 1995 [JP] Japan ................................. 7-346520

[51] Int. Cl.⁶ ............................................ H03F 3/46
[52] U.S. Cl. ................................. 341/200; 341/155
[58] Field of Search ................................ 341/155, 172, 341/200; 327/200, 210

[56] References Cited

U.S. PATENT DOCUMENTS

| | | | |
|---|---|---|---|
| 3,968,486 | 7/1976 | Gerdes | 340/347 |
| 5,600,270 | 2/1997 | Shou et al. | 327/75 |
| 5,631,941 | 5/1997 | Shou et al. | 377/75 |
| 5,650,752 | 7/1997 | Shou et al. | 330/84 |

OTHER PUBLICATIONS

Toshikazu Yoneyama, "Analog–to–Digital Converter", A/D, p. 117, Fig. 5.2, 1993.

*Primary Examiner*—Brian Young
*Assistant Examiner*—Peguy JeanPierre
*Attorney, Agent, or Firm*—Pillsbury Madison & Sutro LLP

[57] ABSTRACT

The present invention provides a quantizing circuit using parallel inverters which exhibits stable performance free of influence of dispersion characteristics of each inverter.

6 Claims, 7 Drawing Sheets

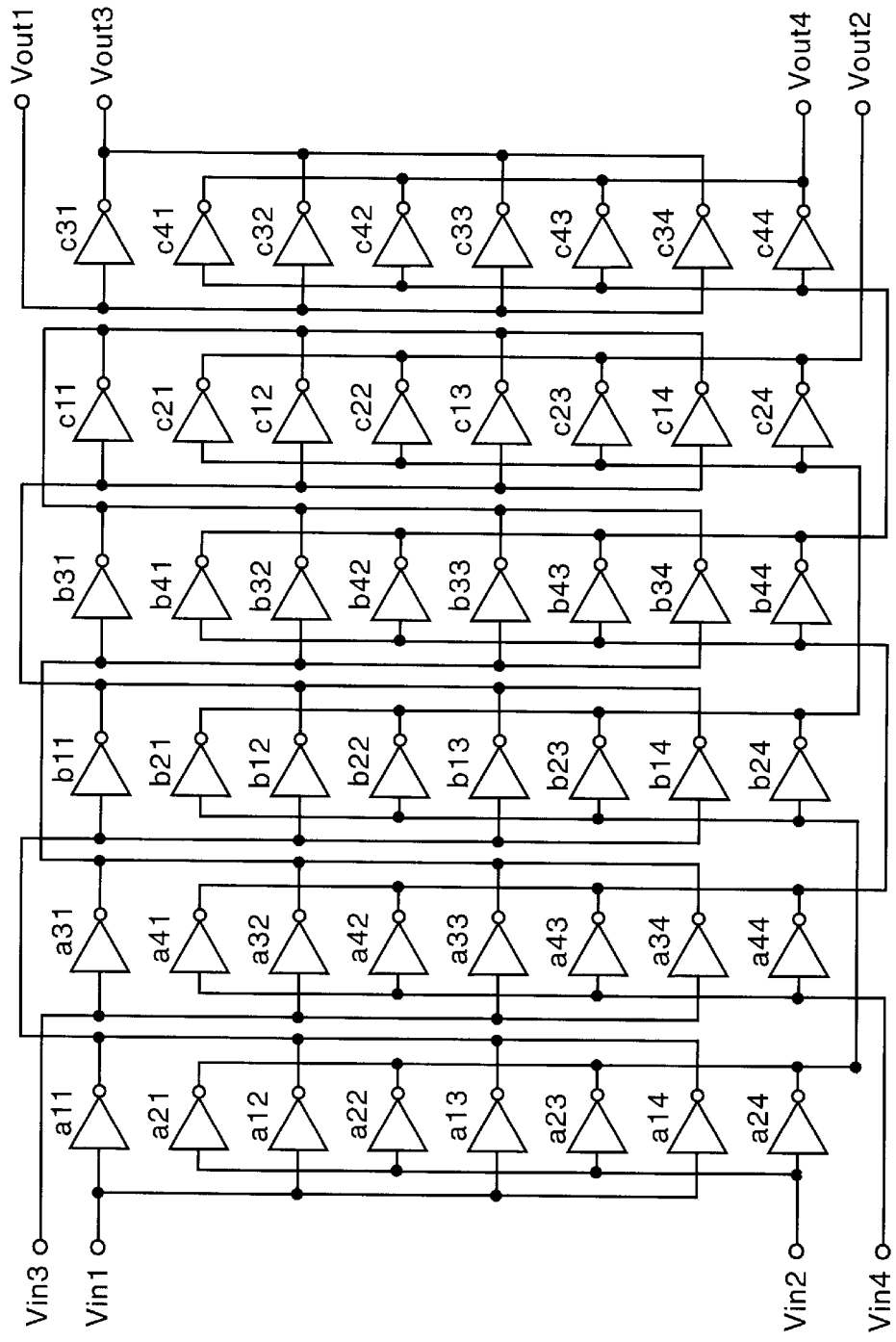

QUANTIZING CIRCUIT

FIELD OF THE INVENTION

The present invention relates to a quantizing circuit for quantizing an input analog signal into predetermined steps of multi-values and a flip-flop using the quantizing circuit, especially to a quantizing circuit and a flip-flop using a C-MOS inverter.

BACKGROUND OF THE INVENTION

A conventional digital computer converts input analog data into digital data by an A/D converter for quantizing.

SUMMARY OF THE INVENTION

However, the conventional structure consumes a large amount of electric power and the size of the circuit becomes large because the A/D converter is a current-driven type.

Therefore, the applicants propose a quantizing circuit in Japanese patent application 6-87384, which comprises n number of thresholding circuits to which an analog input voltage is input, the n number of thresholding circuits being connected so that outputs of the upper bits are input to all the thresholding circuits of the lower bits with the analog input voltage, and predetermined weight is weighted to the connection in order that each thresholding circuit stepwisely repeats inversion and non-inversion according to the change of the analog input voltage. The quantizing circuit realizes a circuit for quantization of n bits by small size and with low power consumption.

But there was a problem that the accuracy of the quantization of the quantizing circuit depends on the dispersion of electronic elements thereof, especially on the dispersion of a threshold voltage of the C-MOS inverter circuit. It was necessary to control the accuracy fundamentally from the level of the elements.

The present invention solves the above conventional problems and has an object to provide a quantizing circuit for realizing the stable performance without the influence of the dispersion of the characteristic of each inverter.

In a quantizing circuit according to the present invention, a plurality of unit inverter circuits are parallelly provided in order to accomplish the object above.

BRIEF DESCRIPTION OF THE DRAWINGS

FIG. 12 shows an arrangement of unit inverters in plan view for structuring three stages of inverter circuits of four systems.

PREFERRED EMBODIMENTS OF THE PRESENT INVENTION

Hereinafter, two embodiments of a quantizing circuit according to the present invention and two flip-flops using the quantizing circuit of the second embodiment are described.

Figure 1:
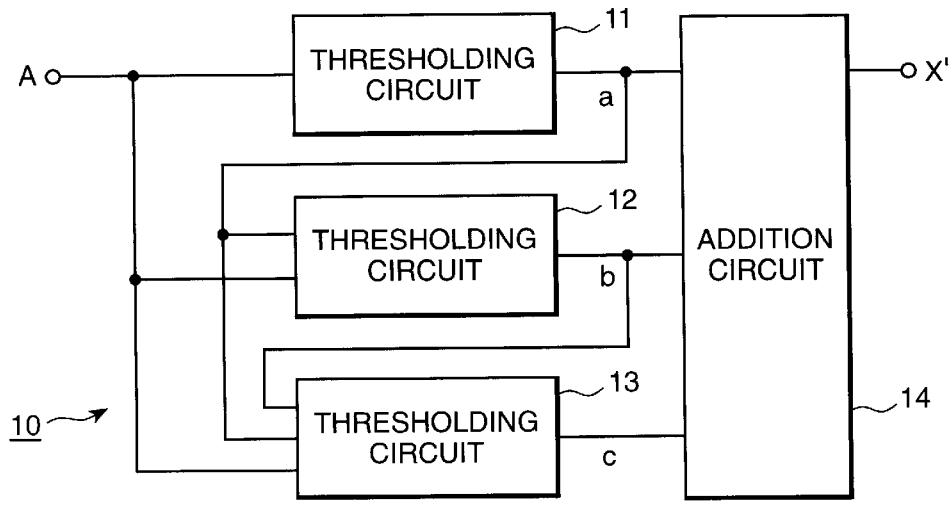
FIG. 1 shows a quantizing circuit of a first embodiment of the present invention.

A quantizing circuit 10 as shown in FIG. 1 of the first embodiment is a correcting circuit for quantizing an analog input voltage A into a multi-valued voltage of three bits level, simultaneously for outputting a signal voltage corresponding to quantized signals. The relationship of analog input voltage A and multi-valued data quantized is shown in TABLE 1 below, assuming the maximum level corresponding to the multi-value 7 is a reference voltage Vd.

TABLE 1

| Input Voltage | Multi-Value |
| --- | --- |
| $0 \leq A < Vd/8$ | 0 |
| $Vd/8 \leq A < 2Vd/8$ | 1 |
| $2Vd/8 \leq A < 3Vd/8$ | 2 |
| $3Vd/8 \leq A < 4Vd/8$ | 3 |
| $4Vd/8 \leq A < 5Vd/8$ | 4 |
| $5Vd/8 \leq A < 6Vd/8$ | 5 |
| $6Vd/8 \leq A < 7Vd/8$ | 6 |
| $7Vd/8 \leq A$ | 7 |

The quantizing circuit 10 consists of three thresholding circuits 11, 12 and 13 which are connected for inverting their outputs when an analog input voltage A is multi-value 4, 2 and 1, respectively, and an addition circuit 14 for adding outputs a, b and c of the respective thresholding circuits after weighting the predetermined weights.

Each of thresholding circuits 11, 12 and 13 corresponds to bits of $2^2$, $2^1$ and $2^0$, respectively, outputs of which are connected to inputs of all the thresholding circuits of lower bits. The predetermined weight is given to the connections in order that each thresholding circuit stepwisely repeats inversions and non-inversions as the analog input voltage A increases.

Each thresholding circuit includes a capacitive coupling with capacitances parallelly connected. The capacitive coupling adds an analog input voltage A and outputs of thresholding circuits of higher threshold. The thresholding circuits outputs the reference voltage Vd when an output of the capacitive coupling is equal to or below tho threshold, and activates and outputs 0 V when the output exceeds the threshold.

An output from thresholding circuit higher by n stages is weighted by a weight of $2^n$, and the input voltage A is weighted by $2^{m+1}$ by the capacitances, assuming the weight for the output of the thresholding circuit of the highest stage to be $2^m$.

Figure 2A:
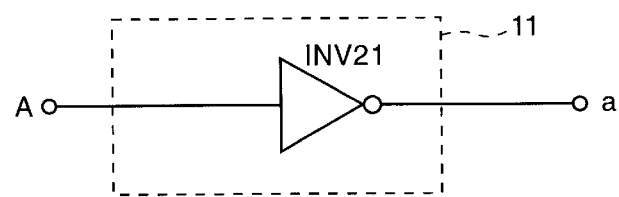
FIG. 2 shows a thresholding circuit in the complement circuit in FIG. 1.

Thresholding circuit 11 consists of an inverter circuit 21 as shown in FIG. 2(a). The threshold level of an inverter circuit INV21 is Vd/2. When an input voltage is the level equivalent to the multi-value 4, it activates. The inverter circuit INV21 can adopt the one-step inverter circuit as shown or an odd number of serial inverter circuits.

Figure 2B:
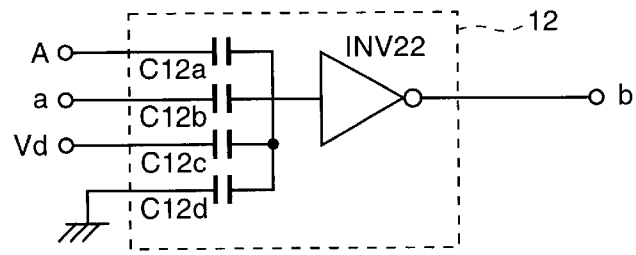

Thresholding circuit 12 consists of capacitances C12a, C12b and C12c to which an input voltage A, an output "a" of the thresholding circuit 11 and the reference voltage Vd are input, respectively, a grounded capacitance C12d, and an inverter circuit INV22 to which a common output of the capacitances is input as shown in FIG. 2(b). The capacitance ratio of capacitances C12a, C12b, C12c and C12d is settled as 4:2:1:1. The inverter circuit INV22 may be an odd number of serial inverter circuits similar to FIG. 2(a).

Figure 2C:
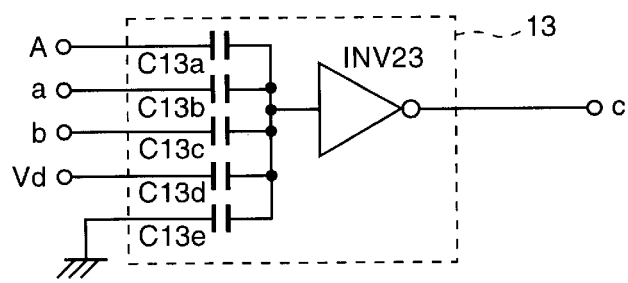

Similar to the above, thresholding circuit 13 consists of capacitances C13a, C13b, C13c and C13d to which an input voltage A, an output "a" and "b" of the thresholding circuit 11 and 12, respectively, and the reference voltage Vd are input, respectively, a grounded capacitance C13e, and an inverter circuit INV23 to which a common output of the capacitances is input as shown in FIG. 2(c). The capacitance ratio of capacitances C13a, C13b, C13c, C13d and C13e is settled as 8:4:2:1:1. The inverter circuit INV23 may be an odd number of serial inverter circuits.

Assuming that the electrostatic capacity of each capacitance is Ci, an input voltage of each capacitance is Vi, a voltage Vout capacitively coupled by a capacitance in a thresholding circuit can be expressed by the formula (1).

$$V\text{out} = \frac{(\Sigma Ci \cdot Vi)}{(\Sigma Ci)} \quad (1)$$

The thresholds of thresholding circuits 11, 12 and 13 are common, and all of them are Vd/2. When Vout exceeds Vd/2, thresholding circuits 12 and 13 ignite and their outputs are inverted.

An output of each thresholding circuit of the analog input voltage A is shown in TABLE 2. In TABLE 2, actual voltages are obtained by multiplying data in the table by the reference voltage Vd. Vout12 and Vout13 are the results of the voltages of thresholding circuits 12 and 13, respectively, by the capacitive coupling before they input to inverters are calculated by the formula (1). When the values of Vout12 and Vout13 are smaller than Vd/2, the output is non-inverted and the inverter outputs Vd, and when they are larger than Vd/2, the output is inverted and the inverter outputs 0.

TABLE 2

| | | | | | | | | | |
|---|---|---|---|---|---|---|---|---|---|
| THRESHOLDING CIRCUIT 11 | | | | | | | | | |
| Input Voltage A | 0 | 1/8 | 2/8 | 3/8 | 4/8 | 5/8 | 6/8 | 7/8 | 8/8 |
| Output "a" | | 1 | 1 | 1 | 1 | 0 | 0 | 0 | 0 |
| THRESHOLDING CIRCUIT 12 | | | | | | | | | |
| Input Voltage A × 4 | 0 | 0.5 | 1 | 1.5 | 2 | 2.5 | 3 | 3.5 | 4 |
| Input "a" × 2 | 2 | 2 | 2 | 2 | 2 | 0 | 0 | 0 | 0 |
| $V_d$ | 1 | 1 | 1 | 1 | 1 | 1 | 1 | 1 | 1 |
| Vout12 | 3/8 | 3.5/8 | 4/8 | 4.5/8 | 5/8 | 3.5/8 | 4/8 | 4.5/8 | 5/8 |
| Output "b" | | 1 | 1 | 0 | 0 | 1 | 1 | 0 | 0 |
| THRESHOLDING CIRCUIT 13 | | | | | | | | | |
| Input Voltage A × 8 | 0 | 1 | 2 | 3 | 4 | 5 | 6 | 7 | 8 |
| Input "a" × 4 | 4 | 4 | 4 | 4 | 4 | 0 | 0 | 0 | 0 |
| Input "b" × 2 | 2 | 2 | 2 | 0 | 0 | 2 | 2 | 0 | 0 |
| $V_d$ | 1 | 1 | 1 | 1 | 1 | 1 | 1 | 1 | 1 |
| Vout13 | 7/16 | 8/16 | 9/16 | 8/16 | 9/16 | 8/16 | 9/16 | 8/16 | 9/16 |
| Output "c" | | 1 | 0 | 1 | 0 | 1 | 0 | 1 | 0 |

Figure 3A:
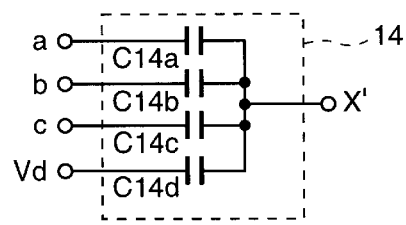
FIG. 3 shows an addition circuit in the complement circuit in FIG. 1.
Figure 3B:
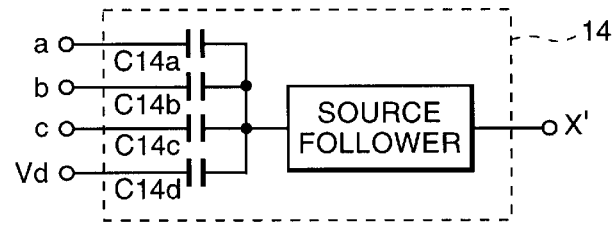

An addition circuit 14 connected to the thresholding circuits is structured by capacitances C14a, C14b, C14c and C14d connected in parallel as shown in FIG. 3(a), or is structured by capacitances and a source follower which consists of two MOS transistors Tr41 and Tr42 parallelly connected as shown in FIG. 3(b). Outputs a, b and c of thresholding circuits 11, 12 and 13, are input to capacitances C14a, C14b and C14c, respectively. At the same time, the reference voltage Vd is input to the capacitance C14d.

The ratio of capacities of capacitances C14a, C14b, C14c and C14d is settled to be 4:2:1:1 so as to be weighted by the weight of $2^n$ according to the stages of outputs of the thresholding circuits I1, I2 and I3, that is, 4:2:1 here.

The relationship between the input voltage (A) and an output X' of the addition circuit 14 shown in FIG. 3(a) is shown in TABLE 3 below, together with weighted outputs of the thresholding circuits. The output voltage X' is the complement of an octal number of the input voltage A.

TABLE 3

| Input Voltage A | 0 | 1/8 | 2/8 | 3/8 | 4/8 | 5/8 | 6/8 | 7/8 | 8/8 |
|---|---|---|---|---|---|---|---|---|---|
| Input a × 4 | | 4 | 4 | 4 | 4 | 0 | 0 | 0 | 0 |
| Input b × 2 | | 2 | 2 | 0 | 0 | 2 | 2 | 0 | 0 |
| c | | 1 | 0 | 1 | 0 | 1 | 0 | 1 | 0 |
| Vd | | 1 | 1 | 1 | 1 | 1 | 1 | 1 | 1 |
| Output X' | | 8/8 | 7/8 | 6/8 | 5/8 | 4/8 | 3/8 | 2/8 | 1/8 |

The addition circuit 14 in FIG. 3(a) outputs the capacitively coupled voltage as it is. The formula (1) of the capacitive coupling is effected when the impedance of output is approximately infinite. Therefore, the addition circuit 14 is effective when an input impedance of a circuit to be connecting to the addition circuit 14 is infinite. When it cannot be guaranteed, the circuit using a source follower as shown in FIG. 3(b) is necessary.

When addition circuits (a) and (b) are used as shown in TABLE 3, the boundary voltages value of output steps of the input voltage A are output as it is. Considering the case for processing an output of the quantizing circuit by a multi-valued logic circuit having a boundary value similar to these thresholding circuits, the output voltage X' is desirably at an intermediate level of the successive boundary values as shown below.

For example, when the output voltage is 5Vd/8, the circuit for receiving the output is effected when the voltage is judged to be multi-value 5 by the classification according to the TABLE 1. When the input voltage slightly changes by a noise, judgment is confused whether the output is to be 4 or 5. That is, some errors may occur in the logic.

first embodiment by a capacitive coupling of an addition circuit 14 after the respective outputs are inverted by inverter circuits INV41, INV42 and INV43. The structures of each thresholding circuit 11, 12 and 13, and the capacitance ratio of a capacitance in an addition circuit 14 is the same as the first embodiment. The structures of inverter circuits INV41, INV42, INV43 are one stage or odd number of stages of serially connected inverters.

An inverter outputs the reference voltage Vd when an input from the thresholding circuit is 0 V, and outputs 0 V when the input is the reference voltage.

The relationship between the input voltage A and an output of the addition circuit 14 is shown in TABLE 5 below, together with weighted outputs of the inverters INV41, INV42 and INV43. An output voltage X is a multi-value output of a stages of an input voltage A.

TABLE 4

| Input Voltage A | 0 | 1/8 | 2/8 | 3/8 | 4/8 | 5/8 | 6/8 | 7/8 | 8/8 |
|---|---|---|---|---|---|---|---|---|---|
| Output X' | | 15/16 | 13/16 | 11/16 | 9/16 | 7/16 | 5/16 | 3/16 | 1/16 |

TABLE 5

| | | | | | | | | | |
|---|---|---|---|---|---|---|---|---|---|
| Input Voltage A | 0 | 1/8 | 2/8 | 3/8 | 4/8 | 5/8 | 6/8 | 7/8 | 1 |
| Output of Inverter INV41 | | 0 | 0 | 0 | 0 | 4 | 4 | 4 | 4 |
| Output of Inverter INV42 | | 0 | 0 | 2 | 2 | 0 | 0 | 2 | 2 |
| Output of Inverter INV43 | | 0 | 1 | 0 | 1 | 0 | 1 | 0 | 1 |
| Reference Voltage Vd | | 1 | 1 | 1 | 1 | 1 | 1 | 1 | 1 |
| Output X' of Addition Circuit L4 | | 1/16 | 3/16 | 5/16 | 7/16 | 9/16 | 11/16 | 13/16 | 15/16 |

Figure 3C:
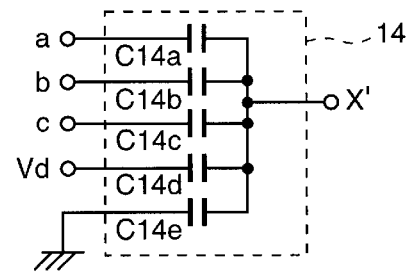

When outputs are settled as in TABLE 4, the possibility of wrong judgment decreases in the circuit for receiving output X' even if some change of voltage occurs. Such a settlement can be realized by using addition circuit 14 in FIG. 3(c). The circuit in FIG. 3(c) includes a grounded capacitance C14e in addition to the circuit in FIG. 3(a). The ratio of the capacities of capacitances C14a, C14b, C14c, C14d and C14e is 8:4:2:1:1.

In the first embodiment, the threshold level of all inverters is Vd/2, which is common. Their capacities are distributed by the ratio of capacitances above in order to divide voltages from 0 to Vd into 8 stages. The capacity distribution of the capacitances will be different when threshold levels are different one by one, or when the total voltage is divided in another way.

Figure 4:
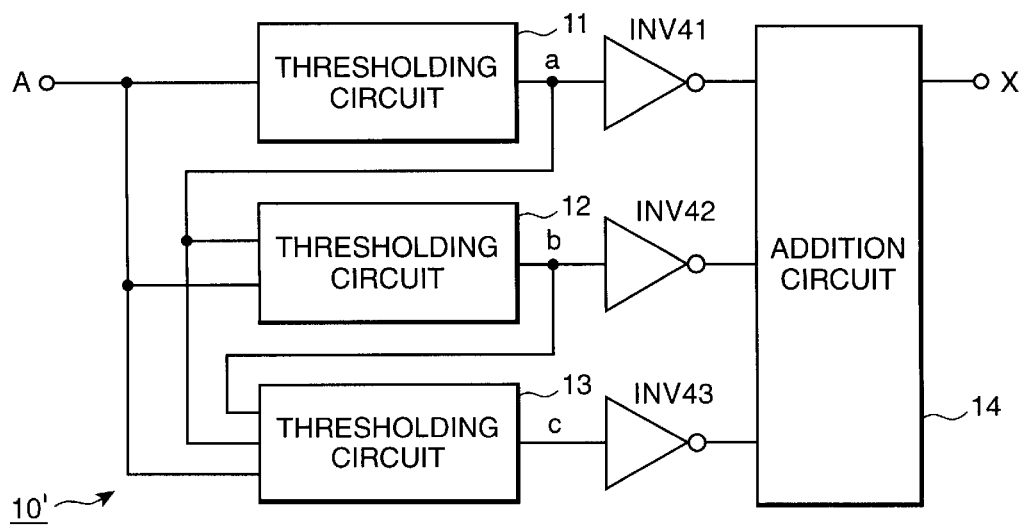
FIG. 4 shows a quantizing circuit of a second embodiment.

FIG. 4 shows a quantizing circuit 10' of the second embodiment. The circuit of the second embodiment outputs a signal voltage for 3 bits quantization of an analog input voltage by adding outputs of each thresholding circuit of the In the two embodiments above, the stages of quantization is 3 bits. More stages of quantization can be easily realized by increasing thresholding circuits with similar structure. In the structure of the embodiments, omitting the addition circuit 14 for output, 3 bits digital signals of a, b and c which are outputs of three thresholding circuits 11, 12 and 13, respectively, can be parallelly output.

Figure 5:
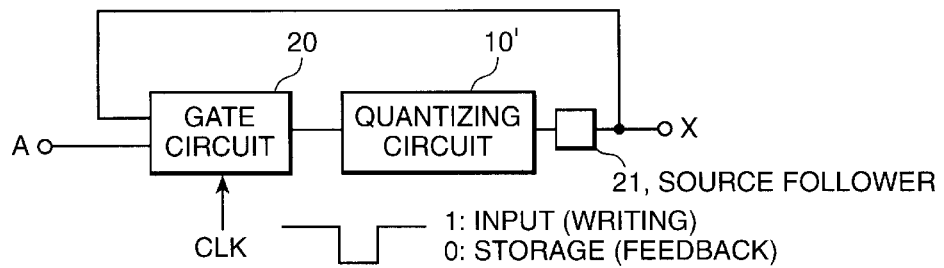
FIG. 5 shows a D-type flip-flop using the quantizing circuit in the second embodiment.

FIG. 5 shows a D-type flip-flop structured by combining the quantizing circuit 10' in FIG. 4, the gate circuit 20 and the source follower 21. The gate circuit 20 is controlled by a clock CLK, which switches an input to the quantizing circuit 10' between an input signal A of analog or multi-value from outside or a feedback from an output of the quantizing circuit.

When the clock is 1, the input signal A is input to the quantizing circuit 10' and data is written, and when the clock is 0, an output of the quantizing circuit 10' is fed back and the written data is stored. The input analog signal A can be stored after converting into a multi-value data by the flip-flop in FIG. 5.

The source follower 21 is necessary when the addition circuit 14 is the quantizing circuit 10' and the circuit in FIG. 3(a) is used, but is unnecessary when the circuit in FIG. 3(b) is used.

Figure 6:
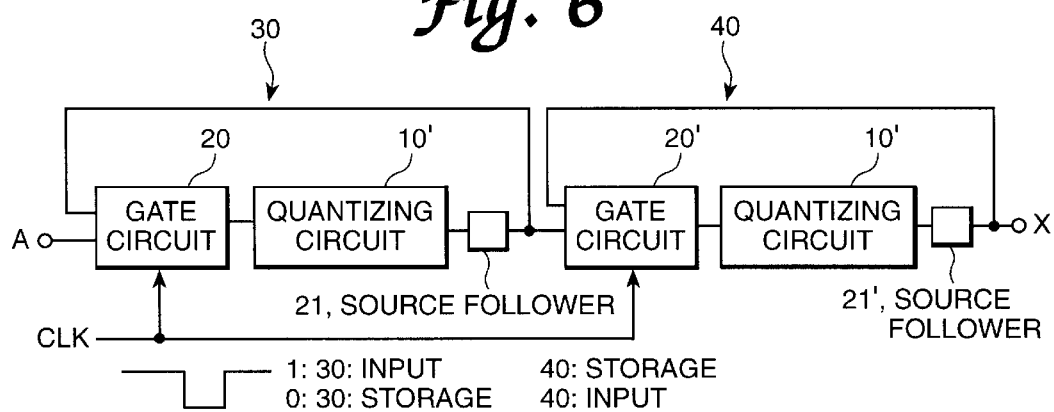
FIG. 6 shows a circuit of the master-slave type flip-flop using the quantizing circuit in the second embodiment.

FIG. 6 shows a master-slave type flip-flop using the quantizing circuit in FIG. 4. A master flip-flop 30 includes the first quantizing circuit 10', the first gate circuit 20 and source follower 21, and a slave flip-flop 40 includes the second quantizing circuit 10', the second gate circuit 20' and a source follower 21'. The structures of flip-flops 30 and 40 are the same as D-type flip-flop shown in FIG. 5.

The first gate circuit 20 is controlled by clock CLK, and selects an input to the first quantizing circuit 10' between a feedback of the first quantizing circuit 10' and an input signal A. the second gate circuit 20' is controlled by the clock CLK. It inputs an output of master flip-flop 30 to the second quantizing circuit 10' when the first gate circuit selects a feedback, and feeds back an output of the second quantizing circuit 10' to the second quantizing circuit 20' when the first gate circuit 20 selects an input signal X.

In the flip-flop in FIG. 6, the master flip-flop 30 stores a quantized input signal A, and the slave flip-flop 40 outputs the data as it is as an output signal A on the timing the clock CLK becomes 0 from 1.

On the timing the clock CLK becomes 1 from 0, the master flip-flop 30 receives an input signal X, and the slave flip-flop 40 functions feedback and continues to output the data without the influence of the input signal A.

Also in this embodiment, the source followers 21 and 21' are necessary when the addition circuit 14 is in the quantizing circuits 10 and 10' and the circuit in FIG. 3(a) is used, but is unnecessary when the circuit in FIG. 3(b) is used.

The structures of inverter circuits INV21, INV22, INV23, INV41, INV42 and INV43 are described. As these inverter circuits are similarly structured, they are represented by INV and the description is made using INV.

Figure 7:
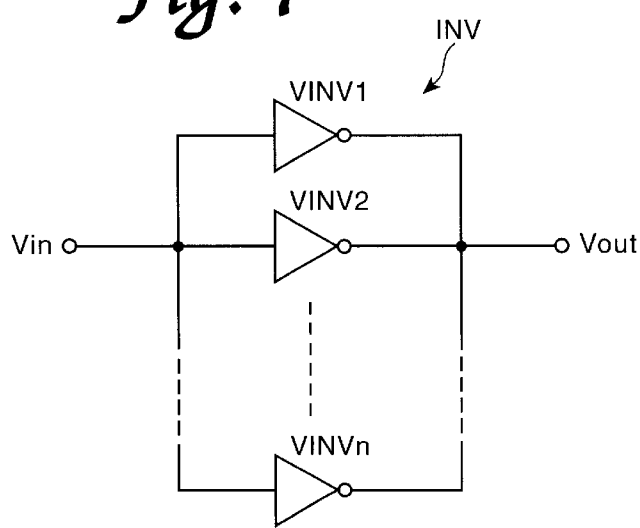
FIG. 7 shows an embodiment of the inverter circuit.

In FIG. 7, an inverter circuit INV has a plurality of unit inverters INV1, INV2, . . . , INVn connected in parallel between an input terminal Vin and an output terminal Vout.

Figure 8:
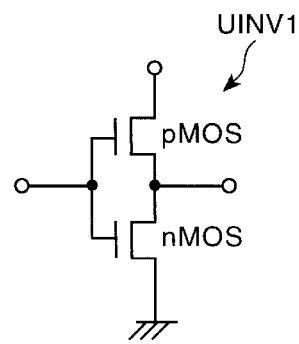
FIG. 8 shows a unit inverter used in the circuit in FIG. 7.

Each unit inverter is a C-MOS inverter structured by a pMOS type FET and an nMOS type FET connected in series as shown in FIG. 8. A threshold voltage Vin of single C-MOS inverter is expressed by the formula (2) below, assuming that a source voltage to be impressed to the pMOS type PET is VDD, a threshold voltage of the pMOS type FET is Vtp, and a threshold voltage of the nMOS type FET is Vtn. When n number of inverters are parallelly connected, the threshold voltage Vin is expressed by the formula (3).

$$V\text{in} = \frac{V_{DD} + V_{tp} + V_{in}\sqrt{\frac{\beta n}{\beta p}}}{1 + \sqrt{\frac{\beta n}{\beta p}}} \quad (2)$$

$$\Sigma \beta pi(V\text{in} - V_{DD} - Vtpi)^2 = \Sigma \beta ni(V\text{in} - Vtni)^2 \quad (3)$$

$$\rho \beta pi(Vin-V_{nn}-Vtpi)^2 = \Sigma \beta ni(Vin-Vtni)^2 \quad (3)$$

βp and βn in the formulas are coefficients shown in formulas (4) and (5) below, assuming that the mobilities of electrons of pMOS type FET and nMOS type FET are μp and μn, respectively, permittivity and thickness of oxidized film of a gate per a unit area are ε and tox, respectively, the width of channel of pMOS type and nMOS type FETs are Wp and Wn, respectively, and the length of channel of them are Lp and Ln.

$$\beta p = \frac{\mu p \epsilon}{tox} \cdot \frac{Wp}{Lp} \quad (4)$$

$$\beta n = \frac{\mu n \epsilon}{tox} \cdot \frac{Wn}{Ln} \quad (5)$$

Though the dispersion of thresholds appears as a normal distribution according to the value of β, the formula (3) cannot be analytically solved because two terms of β are included in the formula (3). The function improves when bipolar transistors are parallelly connected. Generally, it can be predicted that a statistically stable function can be realized by averaging characteristics of elements when they are parallelly connected.

The prospect is confirmed by experimentations. According to a simulation, the variance V1 (Vin) of the threshold voltage Vin expressed by the formula (2) is larger than the variance V2 (Vin) of the threshold voltage Vin expressed by the formula (3).

Figure 9:
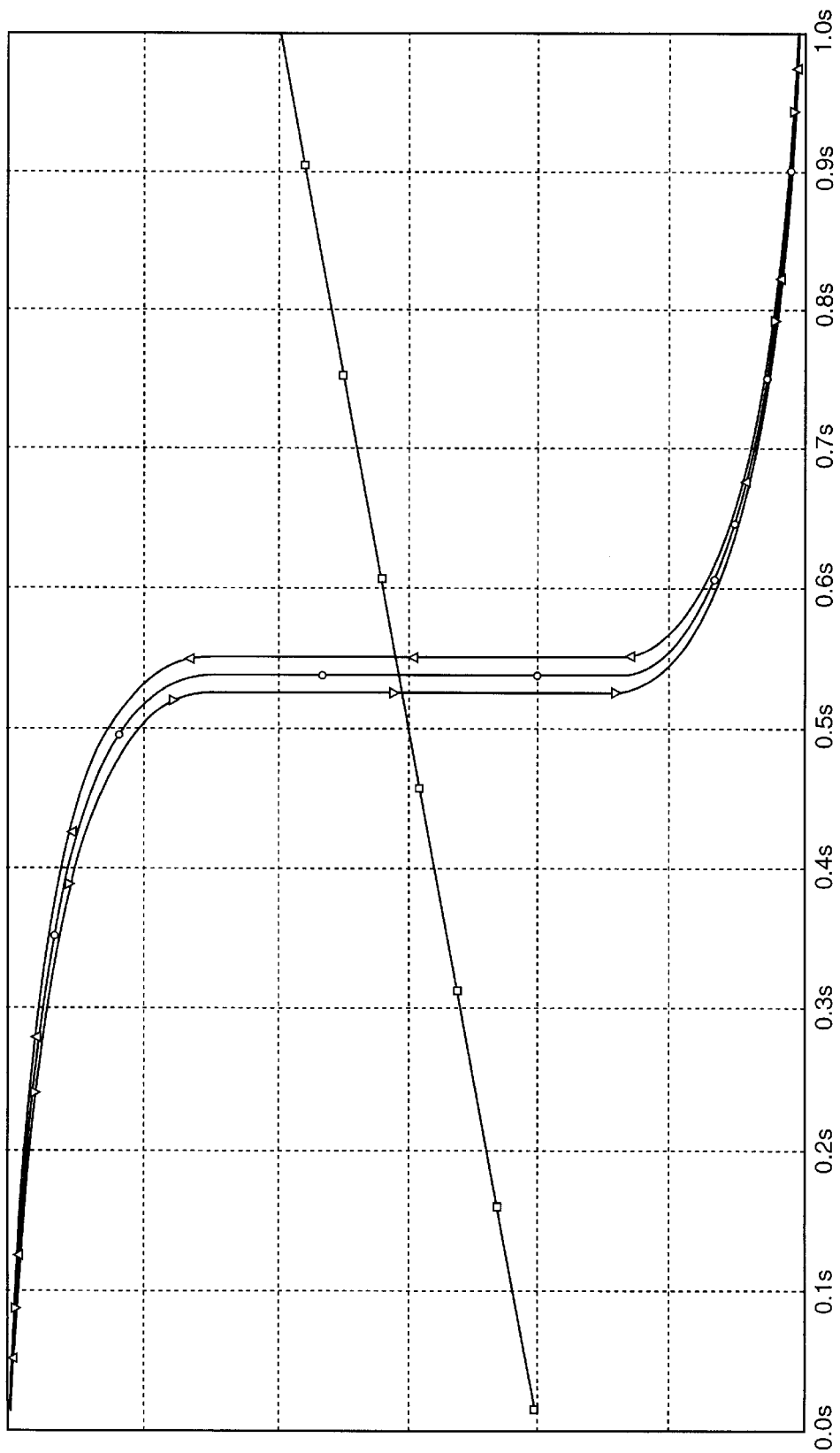
FIG. 9 is a graph showing the characteristics of voltage of two unit inverters and the characteristics of voltage of the inverter circuit parallelly connected the two unit inverters.

FIG. 9 shows a graph of the characteristics of a voltage of an inverter circuit to which two unit inverters are parallelly connected. In the graph, the line □—□ shows the voltage impressed to the input terminal Vin, the lines Δ—Δ and ▽—▽ show the characteristics of each unit inverter, and ○—○ shows the characteristics of an inverter circuit parallelly connected to unit inverters.

As understood from FIG. 9, an averaged characteristic of the characteristics of inverters can be obtained by parallelly connecting two unit inverters. The case where the unit inverters are three or more is similar to it. Therefore, it is possible to statistically improve the accuracy of threshold by parallelly connecting a plurality of unit inverters relative to a single one.

Figure 11:
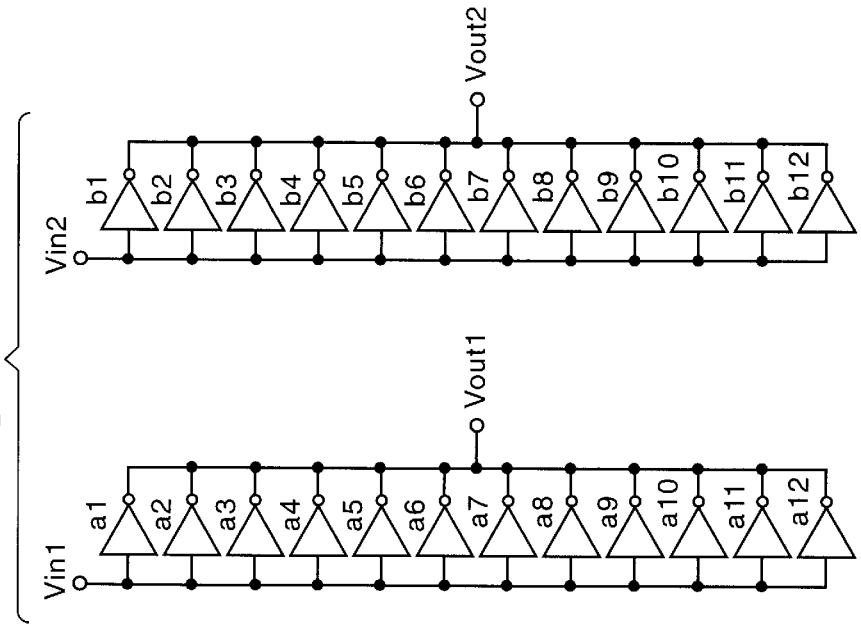
FIG. 11 shows an equivalent circuit in FIG. 10.
Figure 10:
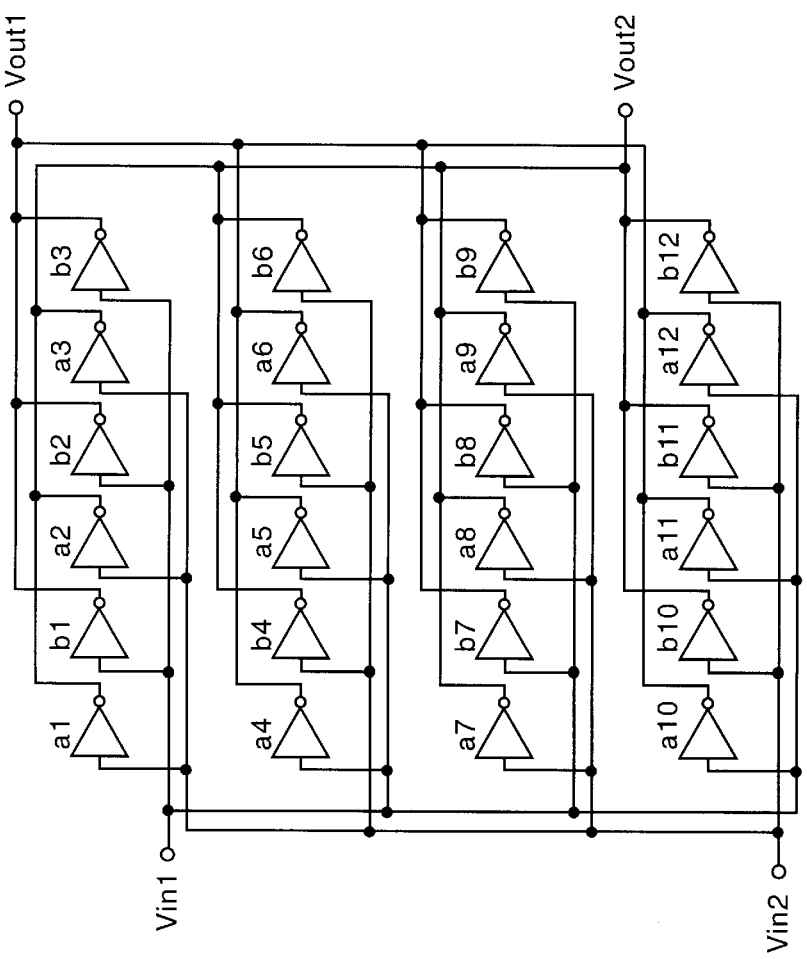
FIG. 10 shows an arrangement of two inverter circuits in ground plan.

FIG. 10 shows an arrangement of unit inverters for constructing two inverter circuits using a plurality of unit inverters of two groups. FIG. 11 shows an equivalent circuit of FIG. 10 in order to clarify each inverter circuit. Each inverter circuit includes 12 unit inverters from a1 to a12 and from b1 to b12 parallelly connected. Input and output terminals from a1 to a12 output Vin1 and Vout1, and input and output terminals from b1 to b12 output Vin2 and Vout2.

In the arrangement of FIG. 10, unit inverters of one inverter circuit and those of another inverter circuit are aligned alternately. Therefore, the corresponding unit inverters of both inverter circuits for example, a1 and b1, and a2 and b2 are adjacently arranged. As, generally, elements made by the same pattern and adjacently arranged have substantially the same characteristics in an LSI, these pairs of unit inverters have substantially the same characteristics. The characteristics of the first and second inverter circuits are closely approximate by parallelly connecting such unit inverters of similar characteristics. Also, the variance disappears and the error compared with design value becomes small.

FIG. 12 shows an arrangement of unit inverters for constructing four sets of three stages of inverters. In an equivalent circuit in FIG. 13, the first system includes three serially connected stages which are i) the first stage parallelly connected unit inverters a11, a12, a13 and a14, ii) the second stage parallelly connected unit inverters b11, b12, b13 and b14, and iii) the third stage parallelly connected unit inverters c11, c12, c13 and c14, the second system includes three serially connected stages which are i) the first parallelly connected unit inverters a21, a22, a23 and a24, ii) the second stage parallelly connected unit inverters b21, b22, b23 and b24, and iii) the third stage parallelly connected unit inverters c21, c22, c23 and c24, the third system includes serially connected three stages which are i) the first stage parallelly connected unit inverters a31, a32, a33 and a34, ii) the second stage parallelly connected unit inverters b31, b32, b33 and b34, and iii) the third stage parallelly connected unit inverters c31, c32, c33 and c34, the fourth system includes serially connected three stages which are i) the first parallelly connected unit inverters a41, a42, a43 and a44, ii) the second stage parallelly connected unit inverters b41, b42, b43 and b44, and iii) the third stage parallelly connected unit inverters c41, c42, c43 and c44. The input and output terminals of the first, second, third and fourth systems are Vin1, Vout1, Vin2, Vout2, Vin3, Vout3, Vin4 and Vout4.

Figure 13:
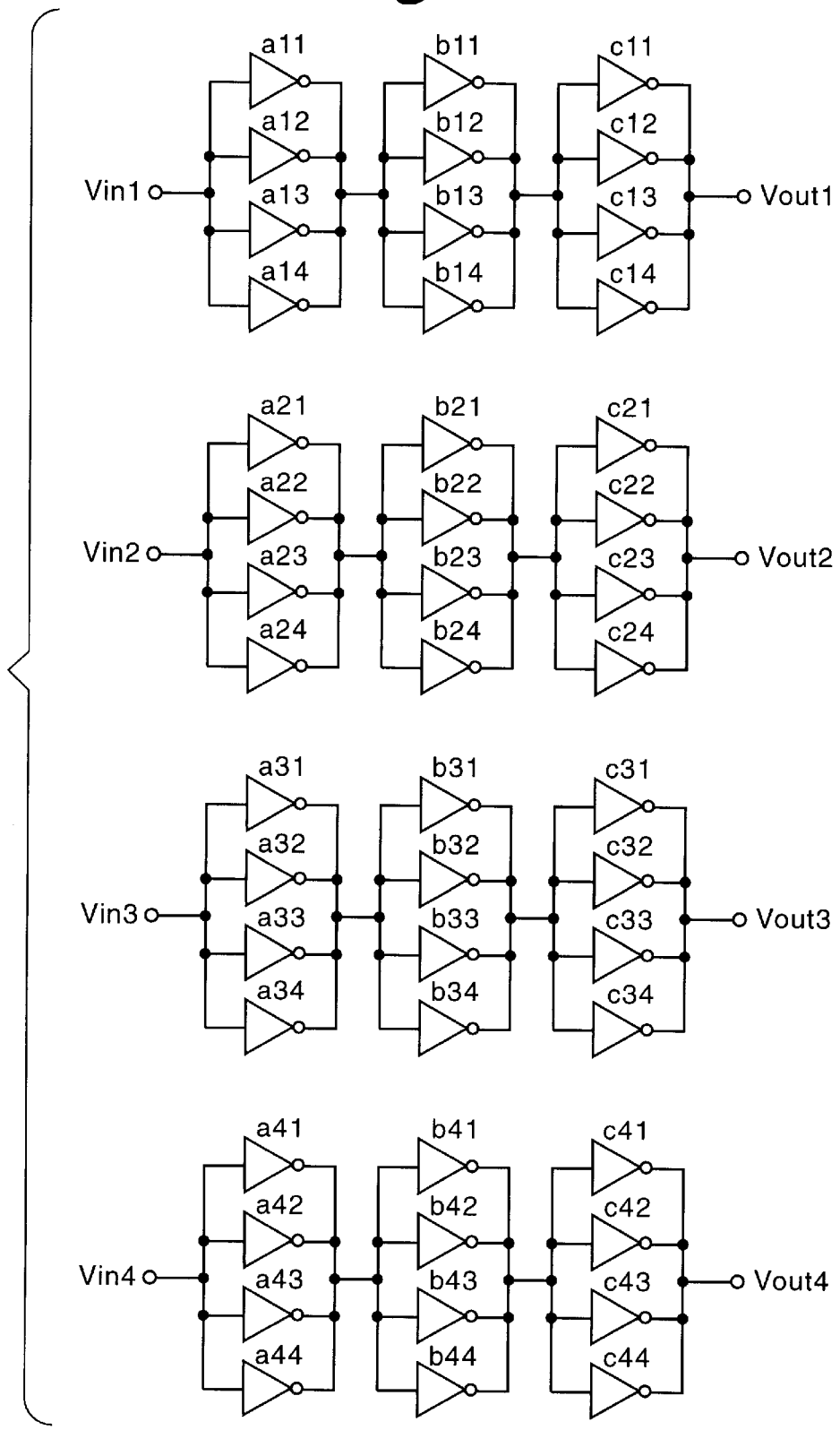
FIG. 13 shows an equivalent circuit in FIG. 12.

With respect to the arrangement for structuring the circuit above in FIG. 13, in an inverter circuit at the first stage, the unit inverters a11 to a14 and a21 to a24 of the first and the second system are alternately aligned, and the unit inverters a31 to a34 and a41 to a44 of the third and the fourth system are alternately aligned. The rows of the first and second systems and the ones of the third and fourth systems are adjacently placed. Corresponding unit inverters, for example, a11, a21, a31 and a41, are adjacently placed with the relationship of upper and lower, and left and right. At the second and third stages, unit inverters are arranged with relationship of location similar to the first stage. As a whole, characteristics are made uniform by adjacently arranging corresponding unit inverters of different systems and the accuracy is improved by parallelly arranging a plurality of unit inverters.

As mentioned above, it is possible to realize an inverter circuit with a statistically stable function by absorbing the variance of each unit inverter by using a plurality of unit inverters parallelly connected, and it is also possible to make uniform the characteristics of inverter circuits by adjacently arranging the corresponding unit inverters in different inverter circuits by the present invention. Consequently, the accuracy of quantization in a quantizing circuit can be improved without controlling the accuracy of elements.

What is claimed is:

1. A quantizing circuit comprising:

n thresholding circuits, with stepwisely different thresholds from a minimum threshold to a maximum threshold, for quantizing an analog input voltage into $2^n$ multi-valued voltage levels;

wherein a thresholding circuit having said maximum threshold includes an odd number of serial inverter circuits with said maximum threshold corresponding to a most significant bit of said n bits;

each of said serial inverter circuits including a plurality of unit inverter circuits connected in parallel;

each of the thresholding circuits other than said thresholding circuit of said maximum threshold includes a weighting circuit for receiving weighted outputs of all thresholding circuits having higher thresholds than said thresholding circuit and an odd number of serial inverter circuits connected to an output of said weighting circuit; and all of said thresholding circuits are for receiving said analog input voltage at respective inputs thereof.

2. A quantizing circuit as claimed in claim 1, wherein each of said unit inverter circuits comprises a C-MOS inverter implemented by serially connected pMOS type and nMOS type FETs.

3. A quantizing circuit as claimed in claim 1, wherein:

each of said unit inverter circuits for a plurality of inverter circuits are adjacently arranged on an LSI substrate; and unit inverters at corresponding locations in different inverter circuits are placed adjacently to each other.

4. A D-type flip-flop comprising:

a) a quantizing circuit including n thresholding circuits, with stepwisely different thresholds from a minimum threshold to a maximum threshold, for quantizing an analog input voltage into $2^n$ multi-valued voltage levels, wherein a thresholding circuit having said maximum threshold includes an odd number of serial inverter circuits with said maximum threshold corresponding to a most significant bit of said n bits, each of said serial inverter circuits including a plurality of unit inverter circuits connected in parallel, each of the thresholding circuits other than said thresholding circuit of said maximum threshold includes a weighting circuit for receiving weighted outputs of all thresholding circuits having higher thresholds than said thresholding circuit and an odd number of serial inverter circuits connected to an output of said weighting circuit, and all of said thresholding circuits are for receiving said analog input voltage at respective inputs thereof; and b) gate means for switching an input to said quantizing circuit between an input from outside and a feedback of an output of said quantizing circuit.

5. A master-slave type flip-flop comprising:

a) a first stare D-type flip-flop including i) a first quantizing circuit having n first thresholding circuits, with stepwisely different thresholds from a minimum threshold to a first maximum threshold, for quantizing an analog input voltage into $2^n$ multi-valued voltage levels, wherein a first thresholding circuit having said maximum threshold includes an odd number of first serial inverter circuits with said first maximum threshold corresponding to a most significant bit of said n bits, each of said first serial inverter circuits including a plurality of unit inverter circuits connected in parallel, each of the first thresholding circuits other than said first thresholding circuit having said first maximum threshold includes a first weighting circuit for receiving weighted outputs of all first thresholding circuits having higher thresholds than said first thresholding circuit and an odd number of serial inverter circuits connected to an output of said first weighting circuit, and all of said first thresholding circuits are for receiving said analog input voltage at respective inputs thereof; and ii) first gate means for switching an input to said first quantizing circuit between an input from outside and a feedback of an output of said first quantizing circuit;

b) a second stage D-type flip-flop connected in series with said first stage D-type flip-flop, said second stage D-type flip-flop including iii) a second quantizing circuit having n second thresholding circuits, with stepwisely different thresholds from a minimum threshold to a second maximum threshold, for quantizing a second analog input signal into $2^m$ multi-valued voltage levels, wherein a second thresholding circuit having said second maximum threshold includes an odd number of second serial inverter circuits with said second maximum threshold corresponding to a most significant bit of said m bits, each of said second serial inverter circuits including a plurality of unit inverter circuits connected in parallel, each of the second thresholding circuits other than said second thresholding circuit having said second maximum threshold includes a second weighting circuit for receiving weighted outputs of all second thresholding circuits having higher thresholds than said second thresholding circuit and an odd number of second serial inverter circuits connected to an output of said second weighting circuit, and all of said second thresholding circuits are for receiving said second analog input signal at respective inputs thereof, and iv) second gate means for switching said second analog input signal as an input to said second quantizing circuit between an output of said first quantizing circuit and a feedback of an output of said second quantizing circuit.

6. A quantizing circuit in an integrated circuit, said quantizing circuit comprising:

n thresholding circuits, with stepwisely different thresholds from a maximum threshold to a minimum threshold, for quantizing an analog input voltage into $2^n$ voltage levels;

wherein said thresholding circuit having said maximum threshold includes three serial inverter circuits with said maximum threshold corresponding to a most significant bit of said binary voltage;

each of other said thresholding circuits than said thresholding circuit of said maximum threshold includes a weighting circuit for receiving said input voltage and all outputs of thresholding circuits of higher thresholds than said thresholding circuit, for weighting said input voltage by a weight of $2^n$ and for weighting said output with a weight of $2^k$ for a thresholding circuit having a higher threshold by k stages, and three stages of serial inverter circuits connected to an output of said weighting circuit; and each of said inverter circuits includes an input terminal and output terminal, and a plurality of C-MOS inverters, inputs of which are commonly connected to said input terminal and outputs of which are commonly connected to said output terminal, said C-MOS inverters of corresponding inverter circuits of different thresholding circuits being adjacently positioned;

whereby a dispersion of said thresholds of said inverter circuits of said different thresholding circuits are minimized.

* * * * *